(12) United States Patent  
Sugiura et al.

(10) Patent No.: US 12,293,930 B2  
(45) Date of Patent: May 6, 2025

(54) SUBSTRATE PROCESSING APPARATUS, METHOD OF MANUFACTURING SEMICONDUCTOR DEVICE AND HEATER

(71) Applicant: Kokusai Electric Corporation, Tokyo (JP)

(72) Inventors: Shinobu Sugiura, Toyama (JP); Masaaki Ueno, Toyama (JP); Tetsuya Kosugi, Toyama (JP); Hitoshi Murata, Toyama (JP); Masashi Sugishita, Toyama (JP); Tomoyuki Yamada, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 929 days.

(21) Appl. No.: 17/349,600

(22) Filed: Jun. 16, 2021

(65) Prior Publication Data

US 2021/0313205 A1    Oct. 7, 2021

Related U.S. Application Data

(63) Continuation of application No. PCT/JP2019/051203, filed on Dec. 26, 2019.

(30) Foreign Application Priority Data

Jan. 7, 2019    (JP) ................ 2019-000743

(51) Int. Cl.  
*H01L 21/67* (2006.01)  
*G05D 23/19* (2006.01)  
(Continued)

(52) U.S. Cl.  
CPC ... *H01L 21/67248* (2013.01); *G05D 23/1931* (2013.01); *H01L 21/324* (2013.01);  
(Continued)

(58) Field of Classification Search  
None  
See application file for complete search history.

(56) References Cited

U.S. PATENT DOCUMENTS

| 5,228,114 A | 7/1993 | Suzuki | |
|---|---|---|---|
| 2013/0017628 A1* | 1/2013 | Kosugi | G01K 13/02 |
| | | | 374/E7.004 |
| 2014/0120636 A1* | 5/2014 | Yamaguchi | G01K 7/02 |
| | | | 219/400 |

FOREIGN PATENT DOCUMENTS

| JP | 52-127477 U | 9/1977 |
|---|---|---|
| JP | 01-210831 A | 8/1989 |

(Continued)

OTHER PUBLICATIONS

Request for the Submission of an Opinion with English translation in Korean Application No. 10-2021-7017798, dated Mar. 2, 2023, 16 pages.

*Primary Examiner* — Elizabeth M Kerr  
(74) *Attorney, Agent, or Firm* — Edell, Shapiro & Finnan, LLC

(57) ABSTRACT

According to one aspect of the technique, there is provided a configuration including: a furnace body covering a reaction chamber; a heating element divided into zones and provided in the furnace body; first temperature sensors provided for the zones such that its temperature measuring point is arranged near the heating element; second temperature sensors provided such that its temperature measuring point is provided close to a temperature measuring point of a first temperature sensor; and temperature meters provided at the zones to hold the temperature measuring points of the first and the second temperature sensors to be close to each other in a protection pipe. Each temperature meter penetrates an outer periphery of the furnace body perpendicular to a central axis of the reaction chamber such that a front end of (Continued)

the protection pipe is located outside the reaction tube and on a tube axis thereof.

15 Claims, 9 Drawing Sheets

(51) Int. Cl.
*H01L 21/324* (2006.01)
*H01L 21/66* (2006.01)
*H01L 21/673* (2006.01)

(52) U.S. Cl.
CPC .. *H01L 21/67109* (2013.01); *H01L 21/67303* (2013.01); *H01L 22/20* (2013.01)

(56) References Cited

FOREIGN PATENT DOCUMENTS

| | | |
|---|---|---|
| JP | 04-165290 A | 6/1992 |
| JP | H04165290 A | 6/1992 |
| JP | 10-270454 A | 10/1998 |
| JP | 2008-53604 A | 3/2008 |
| KR | 1020050091691 A | 9/2005 |

\* cited by examiner

300

SUBSTRATE PROCESSING APPARATUS, METHOD OF MANUFACTURING SEMICONDUCTOR DEVICE AND HEATER

CROSS REFERENCE TO RELATED APPLICATIONS

This application is a continuation of International Application No. PCT/JP2019/051203, filed on Dec. 26, 2019, which claims priority under 35 U.S.C. § 119 to Application No. JP 2019-000743 filed on Jan. 7, 2019, the entire contents of which are hereby incorporated by reference.

TECHNICAL FIELD

The present disclosure relates to a substrate processing apparatus, a method of manufacturing a semiconductor device and a heater.

BACKGROUND

In manufacturing processes of a semiconductor device such as an integrated circuit (IC), a batch type vertical heat treatment apparatus is widely used to perform a heat treatment process on a substrate. For example, a process furnace of a conventional heat treatment apparatus capable of performing the heat treatment process is configured such that a boat capable of accommodating a plurality of wafers (substrates) is inserted into a vertical type reaction tube through a lower end opening of the reaction tube and the heat treatment process is preformed on the plurality of wafers on the boat by a heater provided outside the boat to surround the boat. For example, the reaction tube is of a substantially cylindrical shape whose upper end is closed and whose lower end is open. The plurality of wafers are supported on the boat in a horizontal orientation in a multistage manner with their centers aligned with one another.

For example, the heat treatment apparatus described above is configured such that a thermocouple (also referred to as a "heater thermocouple" or a "spike thermocouple") is arranged in the vicinity of the heater to measure a temperature of a heating structure such as the heater, a thermocouple (also referred to as a "cascade thermocouple" or a "profile thermocouple") is arranged in the vicinity of the plurality of wafers or the reaction tube to measure a temperature of an object to be heated such as the plurality of wafers, and the heater is feedback-controlled based on the measured temperatures. Further, a thermocouple (hereinafter, also referred to as an "overheat detection thermocouple") is arranged in the vicinity of the heater to detect abnormal heating of the heater and to protect the heat treatment apparatus, for example, by forcibly shutting off the heater power supply.

According to some related arts based on the concept of fail-safe, in a case where one of the thermocouples described above fails during performing a process sequence for processing the substrates, an apparatus capable of switching between two adjacent thermocouples including, for example, the heater thermocouple and the overheat detection thermocouple is proposed as the heat treatment apparatus. That is, when one of the two thermocouples (hereinafter, "first thermocouple") fails, the other of the two thermocouples (hereinafter, "second thermocouple") is used as an alternative to the first thermocouple, and a temperature control process is performed based on a temperature measured by the second thermocouple instead of the first thermocouple to control the temperature measured by the second thermocouple to become the same as a target temperature set for the first thermocouple.

However, in the above-described apparatus according to the related arts, even when the two thermocouples are arranged relatively close to each other, a measuring point of the first thermocouple is different from that of the second thermocouple. Therefore, when the second thermocouple is used as the alternative to the first thermocouple and the temperature control process is performed to control the temperature measured by the second thermocouple to become the same as the target temperature set for the first thermocouple, there occurs a discrepancy between the temperature measured by the first thermocouple and the target temperature set for the first thermocouple. As a result, it is difficult to continuously and stably perform the temperature control process.

SUMMARY

Described herein is a technique (or configuration) capable of continuously and stably performing a temperature control process even when a thermocouple serving as a temperature sensor fails.

According to one aspect of the technique of the present disclosure, there is provided a substrate processing apparatus including: a reaction chamber in which a substrate is accommodated; a furnace body provided so as to surround and cover the reaction chamber; a heating element divided into a plurality of zones and provided in the furnace body or on an inner surface of the furnace body; a plurality of first temperature sensors provided for the plurality of zones, respectively, such that a temperature measuring point of each of the first temperature sensors is arranged in vicinity of the heating element; a plurality of second temperature sensors provided such that a temperature measuring point of each of the second temperature sensors is provided close to a temperature measuring point of a corresponding one of the first temperature sensors; and a plurality of temperature meters provided at the plurality of zones and configured to hold the temperature measuring point of the second temperature sensors and the temperature measuring point of the corresponding one of the first temperature sensors to be close to each other in a corresponding one of protection pipes, wherein each of the temperature meters penetrates an outer periphery of the furnace body along a direction perpendicular to a central axis of the reaction chamber such that a front end of each of the protection pipes is located outside the reaction tube and on a tube axis of the reaction tube.

BRIEF DESCRIPTION OF THE DRAWINGS

FIG. 7A is a diagram schematically illustrating the front end of the insulating pipe of the temperature meter 300 when viewed from a direction "B" shown in FIG. 6 and FIG. 7B is a diagram schematically illustrating the front end of the insulating pipe of the temperature meter 300 when viewed from the same direction as FIG. 6.

FIG. 9A is a diagram schematically illustrating the front end of the insulating pipe of the temperature meter 400 when viewed from a direction "B" shown in FIG. 8 and FIG. 9B is a diagram schematically illustrating the front end of the insulating pipe of the temperature meter 400 when viewed from the same direction as FIG. 8.

DETAILED DESCRIPTION

Embodiments

Figure 1:
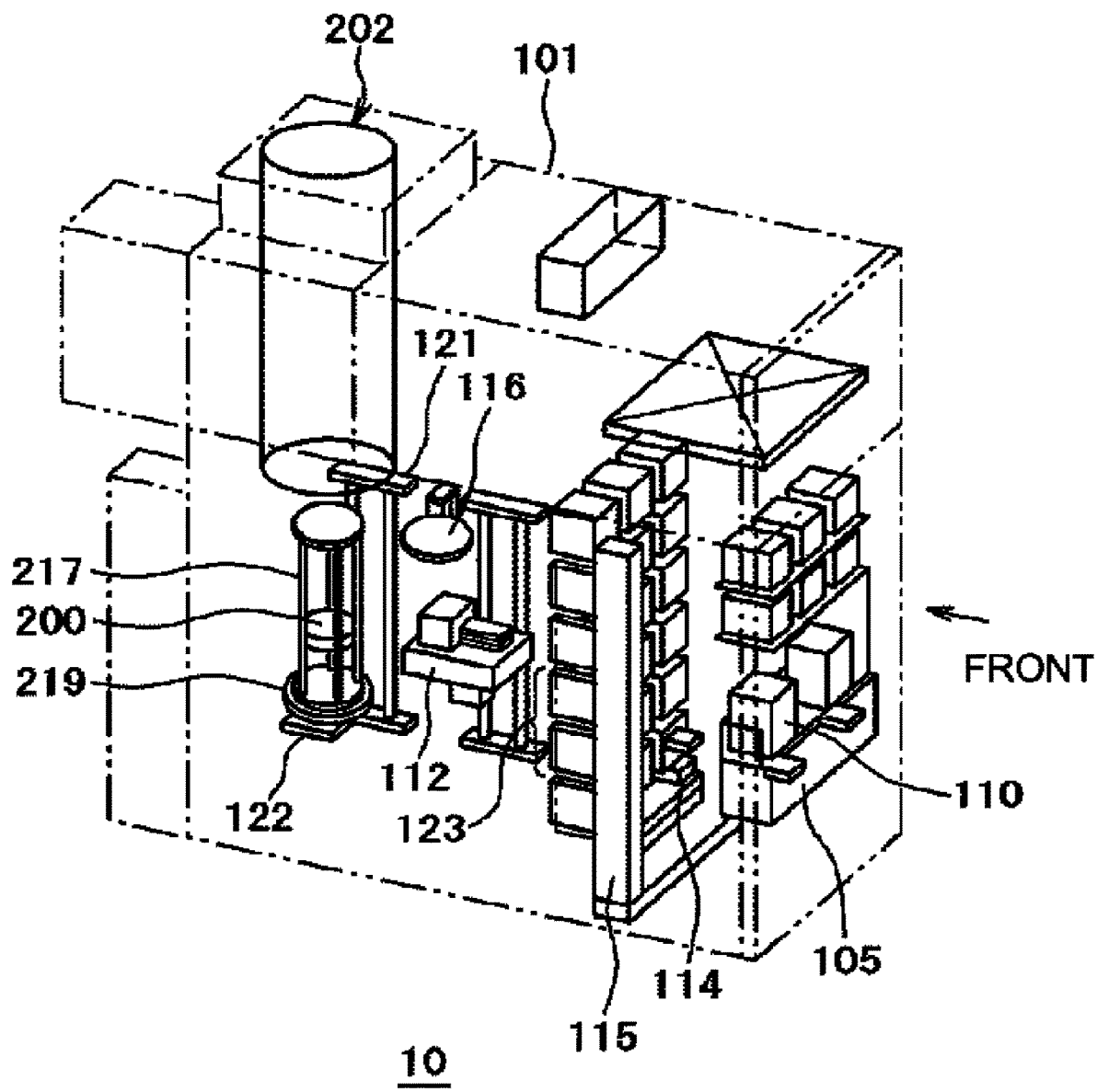
FIG. 1 is a diagram schematically illustrating an oblique perspective view of a substrate processing apparatus according to one or more embodiments described herein.

Hereinafter, one or more embodiments (also simply referred to as "embodiments") according to the technique of the present disclosure will be described with reference to the drawings. An exemplary configuration of a substrate processing apparatus configured to perform a substrate processing such as a heat treatment process will be described with reference to FIG. 1. The substrate processing is performed as a part of manufacturing processes of a semiconductor device. FIG. 1 is a diagram schematically illustrating an oblique perspective view of the substrate processing apparatus according to the embodiments described herein. As shown in FIG. 1, the substrate processing apparatus 10 according to the embodiments includes a housing 101, and a cassette (also referred to as a "pod" or "FOUP") 110 serving as a wafer carrier (also referred to as a "substrate container") is used for transferring a wafer 200 serving as a substrate such as a silicon wafer into or out of the housing 101.

A cassette stage 105 is installed in front of the housing 101. The cassette 110 may be transferred into and placed on the cassette stage 105 by an in-process transfer apparatus (not shown) provided outside the housing 101, and transferred out of the housing 101 from the cassette stage 105 by the in-process transfer apparatus. A cassette shelf 114 is provided at a substantially center portion in a front-rear direction in the housing 101. The cassette shelf 114 is configured to store (accommodate) a plurality of cassettes including the cassette 110. A transfer shelf 123 is provided as a part of the cassette shelf 114. The cassette 110 to be transferred by a wafer transfer apparatus 112 described later is accommodated in the transfer shelf 123. A cassette transfer apparatus 115 is provided between the cassette stage 105 and the cassette shelf 114. The cassette transfer apparatus 115 is configured to transfer the cassette 110 among the cassette stage 105, the cassette shelf 114 and the transfer shelf 123.

The wafer transfer apparatus 112 is provided behind the cassette shelf 114. The wafer transfer apparatus 112 is configured to pick up the wafer 200 from the cassette 110 on the transfer shelf 123 and to transfer (load or charge) the wafer 200 into a boat (also referred to as a "substrate retainer") 217 described later, and is also configured to transfer (unload or discharge) the wafer 200 from the boat 217 and to store (accommodate) the wafer 200 into the cassette 110 on the transfer shelf 123.

A process furnace 202 is provided above a rear side of the housing 101. A lower end of the process furnace 202 is configured to be opened and closed by a furnace opening shutter 116. A configuration of the process furnace 202 will be described later. A boat elevator 121 is provided below the process furnace 202. The boat elevator 121 serves as a transfer apparatus configured to elevate and lower the boat 217 such that the boat 217 is loaded into or unloaded out of the process furnace 202. An arm 122 serving as an elevating table (not shown) is provided at the boat elevator 121. A seal cap 219 is provided horizontally on the arm 122. The seal cap 219 is configured to support the boat 217 vertically. The seal cap 219 also serves as a lid that airtightly closes the lower end of the process furnace 202 when the boat 217 is elevated by the boat elevator 121. A configuration of the boat 217 will be described later.

Configuration of Process Furnace

Figure 2:
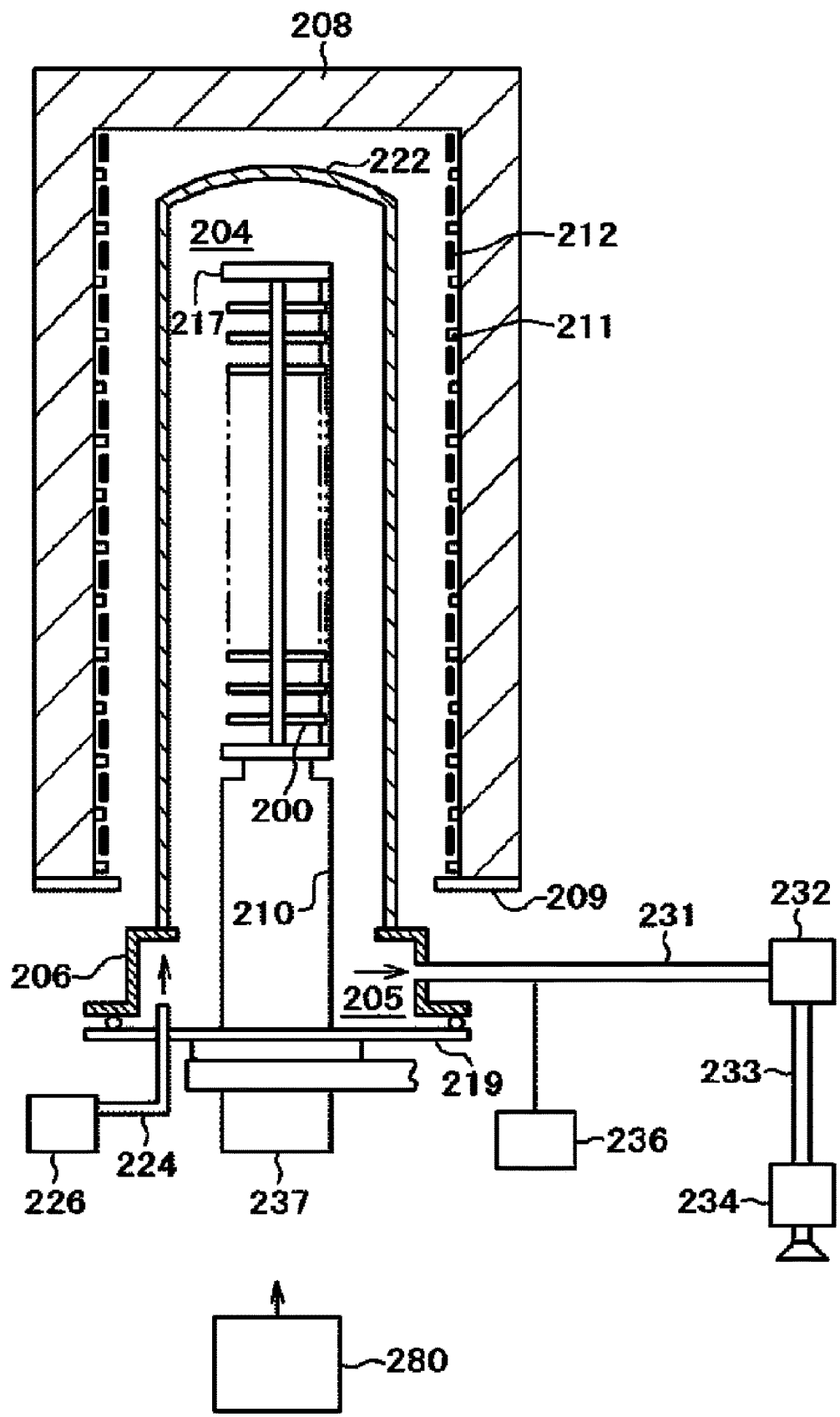
FIG. 2 is a diagram schematically illustrating a vertical cross-section of a process furnace of the substrate processing apparatus according to the embodiments described herein.

Subsequently, the configuration of the process furnace 202 according to the embodiments will be described with reference to FIG. 2. FIG. 2 is a diagram schematically illustrating a vertical cross-section of the process furnace 202 of the substrate processing apparatus 10 according to the embodiments described herein. In the embodiments, the process furnace 202 is configured as a batch and vertical hot wall type heat treatment process furnace.

Reaction Tube

A vertical type reaction tube 222 is provided inside the process furnace 202. The reaction tube 222 is of a substantially cylindrical shape whose upper end is closed and whose lower end is open. The reaction tube 222 is disposed vertically such that its open lower end faces downward and a central axis (also referred to as a "tube axis") of the reaction tube 222 is aligned along a vertical direction. A process chamber 204 is constituted by an inside of the reaction tube 222. The process chamber 204 serves as a reaction chamber in which the boat 217 is accommodated and in which a plurality of wafers including the wafer 200 accommodated in the boat 217 are processed. Hereinafter, the plurality of wafers including the wafer 200 may also be simply referred to as "wafers 200". The wafers 200 are accommodated in the boat 217 serving as the substrate retainer in a horizontal orientation in a multistage manner. An inner diameter of the reaction tube 222 is set to be greater than a maximum outer diameter of the boat 217 in which the wafers 200 are accommodated. According to the present embodiments, the reaction tube 222 is formed as a single body of a substantially cylindrical shape. For example, the reaction tube 222 is made of a highly heat resistant material such as quartz ($SiO_2$) and silicon carbide (SiC).

The lower end of the reaction tube 222 is hermetically sealed by a manifold 206 whose horizontal cross-section is of a substantially circular ring shape. The reaction tube 222 is detachably attached to the manifold 206 for performing a maintenance operation or a cleaning operation. While the manifold 206 is supported by the housing 101, the reaction tube 222 is vertically installed in the housing 101. A lower end opening of the manifold 206 is configured as a furnace opening 205 through which the boat 217 capable of accommodating the wafers 200 is loaded into or unloaded out of the reaction tube 222.

Substrate Retainer

The seal cap 219 capable of closing the lower end opening of the manifold 206 is provided such that the seal cap 219 can be in contact with a lower end of the manifold 206 from thereunder. The seal cap 219 is of a disk shape whose outer diameter is equal to or greater than an outer diameter of the reaction tube 222. The seal cap 219 is elevated or lowered in the vertical direction by the boat elevator 121 installed vertically outside the reaction tube 222 while the disk shape of the seal cap 219 is maintained in a horizontal orientation. The boat 217 as the substrate retainer capable of accommodating the wafers 200 is vertically supported on the seal cap 219. According to the embodiment, for example, the boat 217 includes a pair of upper and lower end plates and a plurality of wafer support columns (boat columns). For example, three wafer support columns are provided vertically. For example, the end plates and the wafer support columns are made of a highly heat resistant material such as quartz ($SiO_2$) and silicon carbide (SiC).

A plurality of support recesses (not shown) are engraved in the horizontal direction at each of the wafer support columns at equal intervals in a lengthwise direction of each of the wafer support columns. Each of the wafer support columns is provided such that the support recesses located at the same stage of each of the wafer support columns face one another and vertical positions (positions in the vertical direction) of the support recesses located at the same stage of each of the wafer support columns coincide with one another. By inserting an edge of the wafer 200 into the support recesses located at the same stage of each of the wafer support columns, the wafers 200 (which are, for example, about 50 to 150 wafers) are vertically arranged in a horizontal orientation in a multistage manner with their centers aligned with one another.

A heat insulating cylinder 210 is installed between the boat 217 and the seal cap 219. The heat insulating cylinder 210 is made of a heat resistant material such as quartz ($SiO_2$) and silicon carbide (SiC). The heat insulating cylinder 210 is configured to suppress the transmission of the heat from a heater 208 described later to the manifold 206.

A boat rotator 237 capable of rotating the boat 217 is provided below the seal cap 219 (opposite to the process chamber 204). A boat rotating shaft of the boat rotator 237 penetrates the seal cap 219 and supports the boat 217 from thereunder. By rotating the boat rotating shaft, it is possible to rotate the wafers 200 in the process chamber 204. The seal cap 219 is configured to be elevated or lowered in the vertical direction by the boat elevator 121 described above, whereby the boat 217 can be loaded into or unloaded out of the process chamber 204. The boat rotator 237 and the boat elevator 121 are electrically connected to a controller 280. The controller 280 is configured to control the boat rotator 237 and the boat elevator 121 so as to perform a desired operation at a desired timing.

Heater

The heater 208 including a furnace body is provided outside the reaction tube 222 so as to surround the reaction tube 222. The heater 208 is capable of heating an inner atmosphere of the reaction tube 222 such that a uniform or predetermined temperature distribution can be obtained in the reaction tube 222. The heater 208 is constituted by the furnace body made of a material such as a heat insulating material and a heating element 212 provided in the vicinity of an inner peripheral surface of the furnace body. For example, the furnace body is of a tubular shape or a box shape. The heater 208 is vertically installed by being supported by a frame 209 of the substrate processing apparatus 10. For example, the heating element 212 is configured as a resistance heating heater such as a carbon heater. According to the embodiments, for example, the heating element 212 is exposed on an inner surface of the furnace body. The heating element 212 may be provided in the furnace body or on the inner surface of the furnace body.

Gas Supply System

A gas supply system will be described with reference to FIG. 2. As shown in FIG. 2, a gas nozzle 224 through which a process gas is supplied into the process chamber 204 is provided so as to penetrate the seal cap 219 in the vertical direction. The gas nozzle 224 may be provided so as to penetrate the manifold 206 in the horizontal direction. A process gas supply apparatus 226 is connected to the gas nozzle 224. The process gas supply apparatus 226 includes a process gas supply source (not shown) of supplying the process gas, a mass flow controller (MFC) (not shown) serving as a flow rate controller and an opening/closing valve (not shown), which are sequentially installed in this order from an upstream side to a downstream side in a flow direction of the process gas. A process gas supplier (which is a process gas supply system) is constituted mainly by the gas nozzle 224. The process gas supplier may further include the process gas supply apparatus 226. The MFC and the opening/closing valve of the process gas supply apparatus 226 are electrically connected to the controller 280. The controller 280 is configured to control the MFC and the opening/closing valve such that a type of a gas such as the process gas supplied into the process chamber 204 is at a desired type at a desired timing and a flow rate of the gas supplied into the process chamber 204 is at a desired flow rate at a desired timing.

Gas Exhaust System

An exhaust pipe 231 through which an inner atmosphere of the process chamber 204 is exhausted is connected to a part of a side wall of the manifold 206. A pressure sensor 236 serving as a pressure detector and an APC (Automatic Pressure Controller) valve 232 serving as a pressure regulator are sequentially installed in this order from the upstream side to the downstream side in the flow direction of the process gas. A vacuum pump 234 serving as a vacuum exhaust apparatus is connected to a downstream side of the APC valve 232 via an exhaust pipe 233. An exhauster (which is an exhaust system) configured to exhaust the gas such as the process gas from the reaction tube 222 is constituted mainly by the exhaust pipe 231. The exhauster may further include the APC valve 232 and the vacuum pump 234. The APC valve 232 and the pressure sensor 236 are electrically connected to the controller 280. The controller 280 is configured to control an opening degree of the APC valve 232 based on pressure values detected by the pressure sensor 236 such that an inner pressure of the process chamber 204 becomes a desired pressure at a desired timing.

Controller

The controller (control structure) 280 includes an operation structure (not shown) or an input/output device (not shown). The controller 280 is electrically connected to components of the substrate processing apparatus 10, and is configured to control the components of the substrate processing apparatus 10. The controller 280 is also configured to command an instruction such as a temperature control instruction, a pressure control instruction, a flow rate control instruction and a machine drive control instruction based on a recipe showing a control sequence of a process such as a film-forming process on a time axis.

Temperature Detecting Structure

Figure 3:
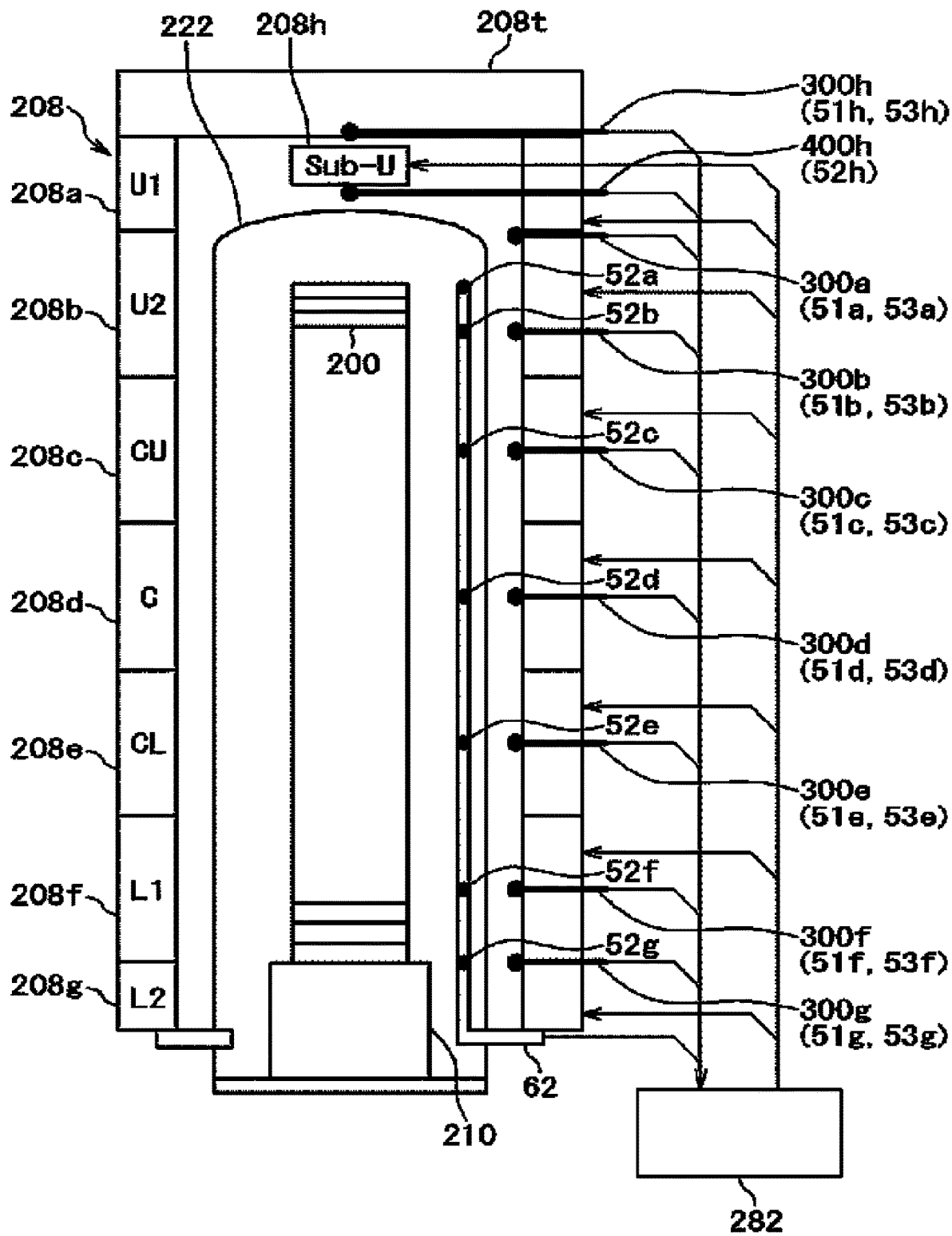
FIG. 3 is a diagram schematically illustrating the process furnace and thermocouples of the substrate processing apparatus according to the embodiments described herein.
Figure 4:
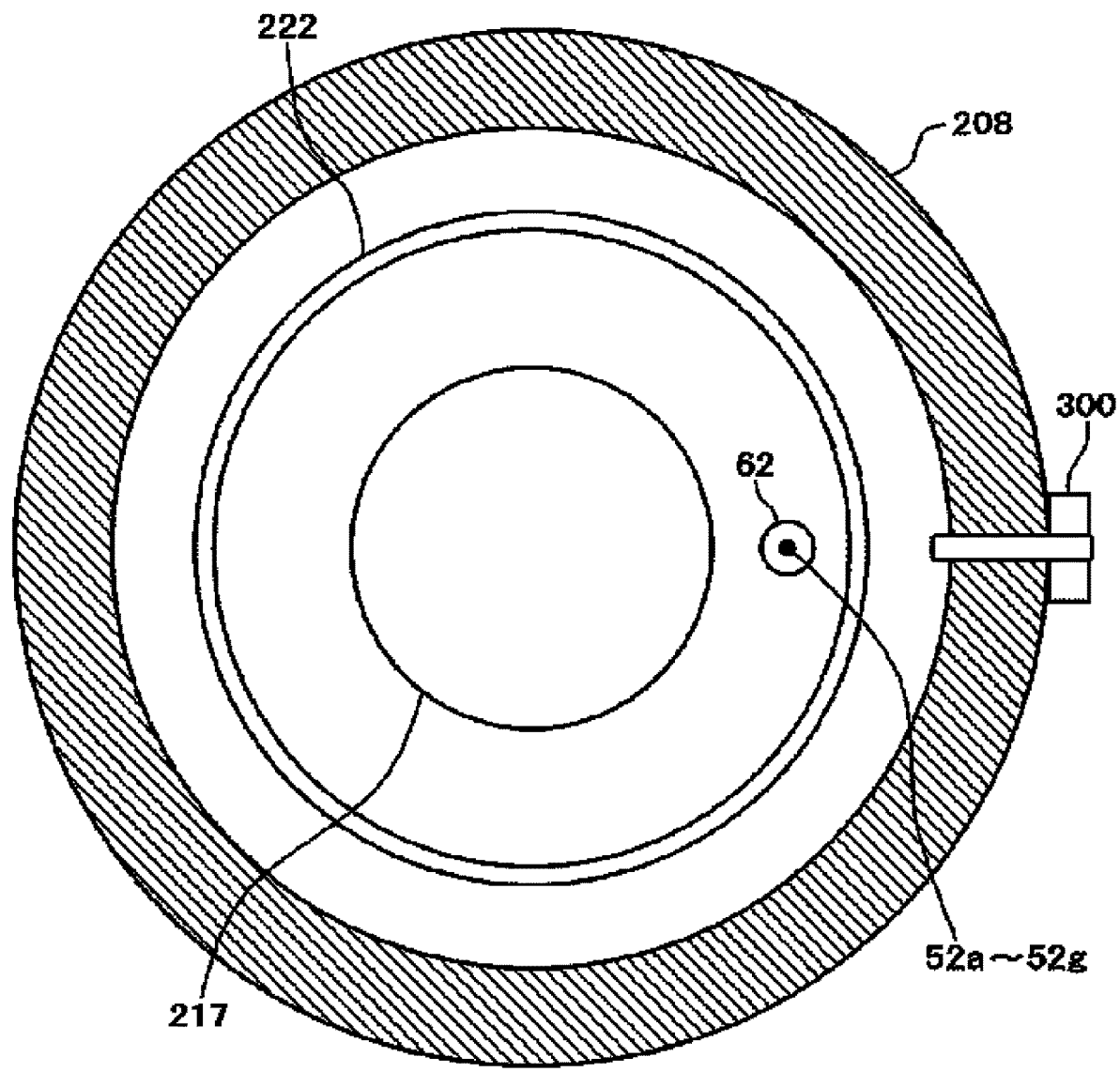
FIG. 4 is a diagram schematically illustrating a horizontal cross-section of the process furnace shown in FIG. 3.

An outline of a temperature detecting structure according to the embodiments described herein will be described with reference to FIGS. 3 and 4. FIG. 3 is a diagram schematically illustrating vertical cross-sections of the process furnace 202 and thermocouples according to the embodiments described herein. FIG. 4 is a diagram schematically illustrating a horizontal cross-section of the process furnace 202 shown in FIG. 3 in the vicinity of each of ribs 211.

As shown in FIG. 3, temperature meters 300a through 300h are provided in the heater 208 so as to penetrate the heater 208 in the horizontal direction, and front ends of the temperature meters 300a through 300h protrude from the ribs 211. The temperature meters 300a through 300h serving as temperature measuring instruments accommodate heater thermocouples 51a through 51h serving as first temperature sensors and overheat detection thermocouples 53a through 53h serving as second temperature sensors. Each junction of the heater thermocouples 51a through 51h and the overheat detection thermocouples 53a through 53h serves as a temperature measuring point, and faces an outer side surface of the reaction tube 222. A distance between each junction and the corresponding heating element 212 or a distance between each junction and the inner surface of the furnace body is smaller than a distance between each junction and each of the wafers 200 or a distance between each junction and the reaction tube 222. Wires of the heater thermocouples 51a through 51h and wires of the overheat detection thermocouples 53a through 53h extend outside the heater 208 and are connected to a temperature controller 282. In the present specification, the temperature meters 300a through 300h may be collectively or individually referred to as a temperature meter 300, the heater thermocouples 51a through 51h may be collectively or individually referred to as a heater thermocouple 51, and the overheat detection thermocouples 53a through 53h may be collectively or individually referred to as a overheat detection thermocouple 53.

Further, as shown in FIG. 3, cascade thermocouples 52a through 52g serving as third temperature sensors are accommodated in a protection pipe 62 provided between the reaction tube 222 and the boat 217. The protection pipe 62 is of a circular pipe shape whose upper end is closed and whose lower end is open. That is, an opening is provided at the lower end of the protection pipe 62. The protection pipe 62 is installed so as to extend in the vertical direction. For example, the protection pipe 62 is made of a highly heat resistant material such as silicon carbide (SiC). A temperature meter 400h accommodating a cascade thermocouple 52h is provided above the reaction tube 222. In the present specification, the cascade thermocouples 52a through 52h may be collectively or individually referred to as a cascade thermocouple 52.

The heater 208 is divided into a plurality of zones (also referred to as heating zones), and sub-heaters described later are provided in the plurality of heating zones, respectively. For example, as shown in FIG. 3, the heater 208 is divided into seven heating zones U1, U2, CU, C CL, L1 and L2. The sub-heaters are provided around the outer side surface of the reaction tube 222. For example, a sub-heater (also referred to as a "U1 zone heater") 208a is provided on an uppermost portion of the furnace body, a sub-heater (also referred to as a "U2 zone heater") 208b is provided immediately below the U1 zone heater 208a, a sub-heater (also referred to as a "CU zone heater") 208c is provided immediately below the U2 zone heater 208b, a sub-heater (also referred to as a "C zone heater") 208d is provided immediately below the CU zone heater 208c, a sub-heater (also referred to as a "CL zone heater") 208e is provided immediately below the C zone heater 208d, a sub-heater (also referred to as an "L1 zone heater") 208f is provided immediately below the CL zone heater 208e, and a sub-heater (also referred to as an "L2 zone heater") 208g is provided immediately below the L1 zone heater 208f and on a lowermost portion of the furnace body. The sub-heaters 208a through 208g are exposed on the inner surface of the furnace body. Resistance heating heaters, which serve as the heating element 212, are provided in the heating zones, respectively. The resistance heating heater provided in the heating zone is controlled individually and independently of the other resistance heating heaters located in the other heating zones. By providing through-holes of the temperature meter 300 on the ribs 211, it is possible to easily and constantly maintain a distance between the front end (junction) of the temperature meter 300 and a heating element located above or below the front end (junction) of the temperature meter 300 in each heating zone. Further, a positional relationship between the front end of the temperature meter 300 and a meandering pattern of the heating element may be adjusted with respect to the plurality of heating zones. The ribs 211 may be interrupted by the through-holes of the temperature meter 300. Further, when the number of stages of the heating element is odd in a certain heating zone, it may be arranged at a position shifted up or down from a center of the heating zone.

Further, above the reaction tube 222, a sub-heater (also referred to as a "Sub-U zone heater") 208h extends to vertically face an inner surface of a ceiling (also referred to as a "lid") 208t of the furnace body with a spatial gap between the sub-heater 208h and the lid 208t. The ceiling 208t includes a heat insulating material and an exhaust port (not shown). For example, cooling air flows to the sub-heaters 208a through 208g of each heating zone through an outer surface side of the furnace body, flows to the inner surface of the furnace body, passes through a space between the reaction tube 222 and the heater 208, and is discharged through the exhaust port of the ceiling 208t.

The heater thermocouple 51a, the cascade thermocouple 52a and the overheat detection thermocouple 53a are provided to detect a temperature of the U1 zone heater 208a of the process furnace 202. The heater thermocouple 51b, the cascade thermocouple 52b and the overheat detection thermocouple 53b are provided to detect a temperature of the U2 zone heater 208b. The heater thermocouple 51c, the cascade thermocouple 52c and the overheat detection thermocouple 53c are provided to detect a temperature of the CU zone heater 208c. The heater thermocouple 51d, the cascade thermocouple 52d and the overheat detection thermocouple 53d are provided to detect a temperature of the C zone heater 208d. The heater thermocouple 51e, the cascade thermocouple 52e and the overheat detection thermocouple 53e are provided to detect a temperature of the CL zone heater 208e. The heater thermocouple 51f, the cascade thermocouple 52f and the overheat detection thermocouple 53f are provided to detect a temperature of the L1 zone heater 208f. The heater thermocouple 51g, the cascade thermocouple 52g and the overheat detection thermocouple 53g are provided to detect a temperature of the L2 zone heater 208g. The heater thermocouple 51h, the cascade thermocouple 52h and the overheat detection thermocouple 53h are provided to detect a temperature of the Sub-U zone heater 208h. In general, the heater thermocouple 51, the cascade thermocouple 52 and the overheat detection thermocouple 53 are provided at positions corresponding to the ribs 211 within a height range of the corresponding heating zone (for example, in the vicinity of a center of the corresponding heating zone). However, components such as the heater thermocouple 51a may be provided in the vicinity of a lower end of the heating zone U1, and components such as the heater thermocouple 51g may be provided in the vicinity of an upper end of the heating zone L2.

Temperatures measured by the heater thermocouples 51a through 51h are feedback-controlled for each divided element (heating zone) independently or in cooperation with one another. While referring to the measured temperatures of the heater thermocouples 51a through 51h, a calorific value of the heater 208 is controlled such that differences (errors) between a target temperature and the temperatures measured by the cascade thermocouples 52a through 52h are reduced. While referring to the measured temperatures of the cascade thermocouples 52a through 52h by using the overheat detection thermocouples 53a through 53h without using the heater thermocouples 51a through 51h, the calorific value of the heater 208 may be controlled such that differences (errors) between the target temperature and temperatures measured by the overheat detection thermocouples 53a through 53h are reduced.

Figure 5:
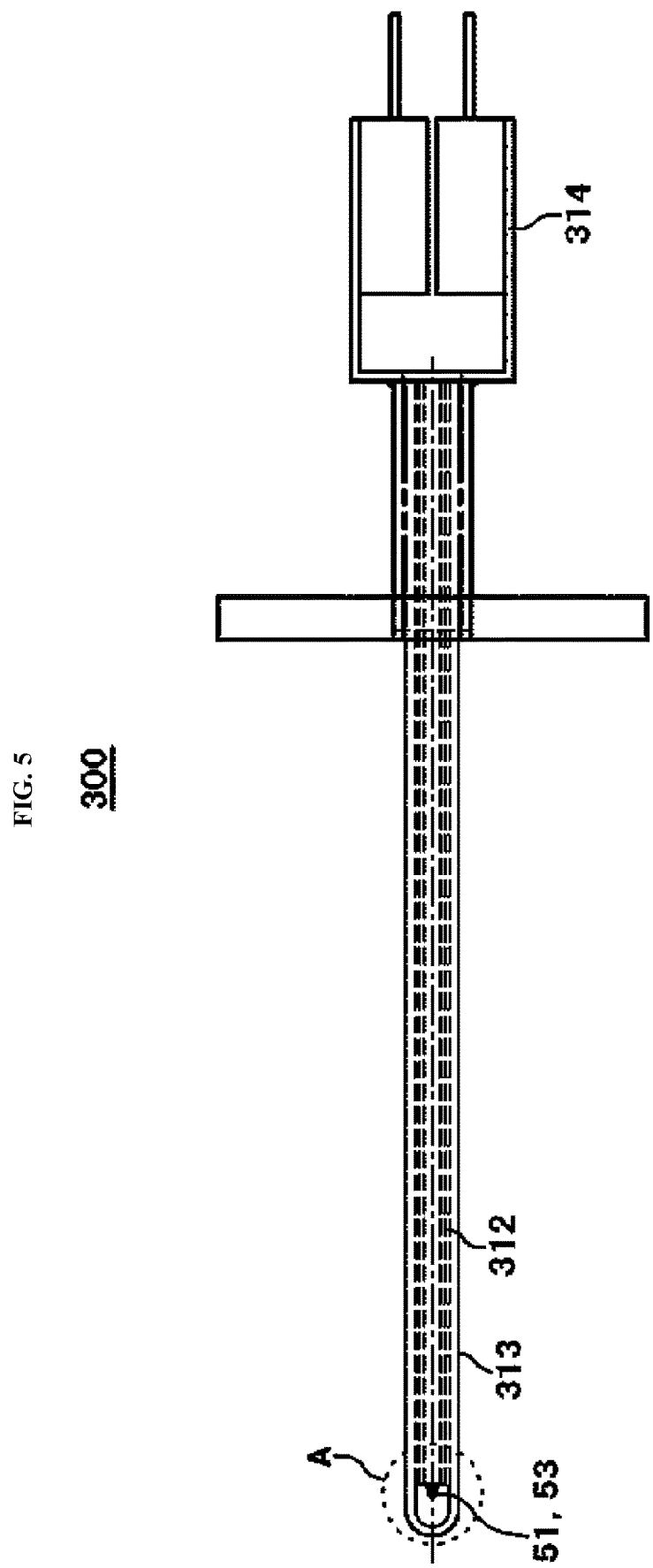
FIG. 5 is a diagram schematically illustrating a structure of a temperature meter 300 according to the embodiments described herein.
Figure 6:
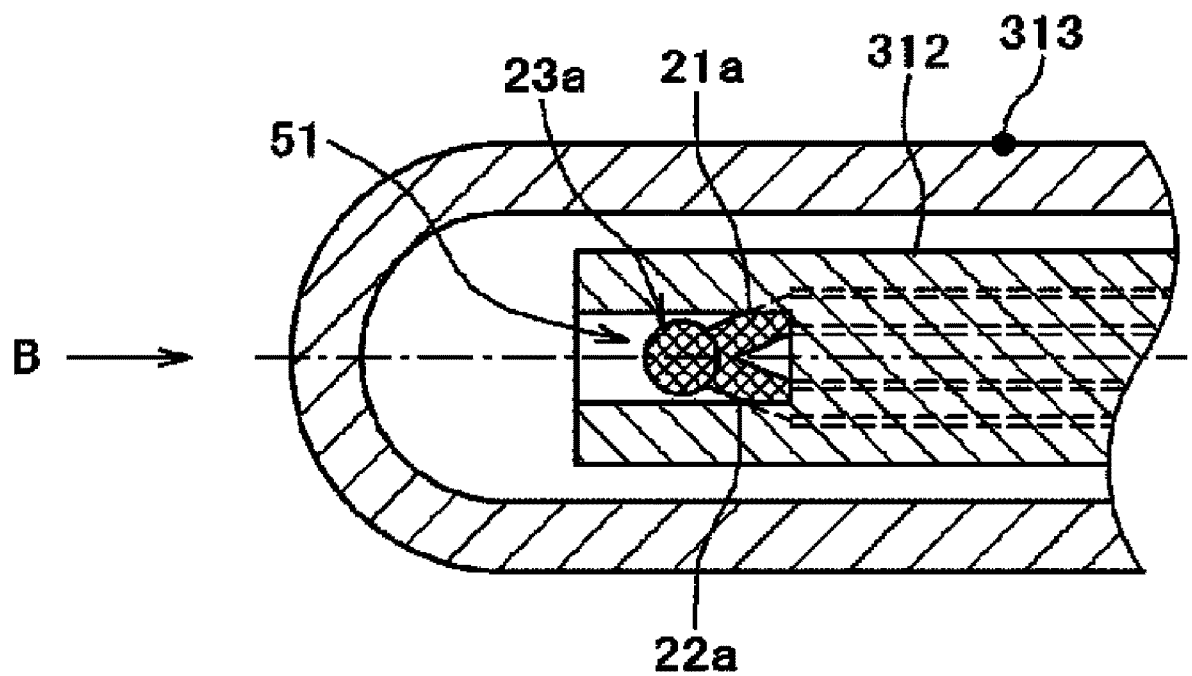
FIG. 6 is a diagram schematically illustrating an enlarged view of a cross-section of a circle "A" shown in FIG. 5.
Figures 7A, 7B:
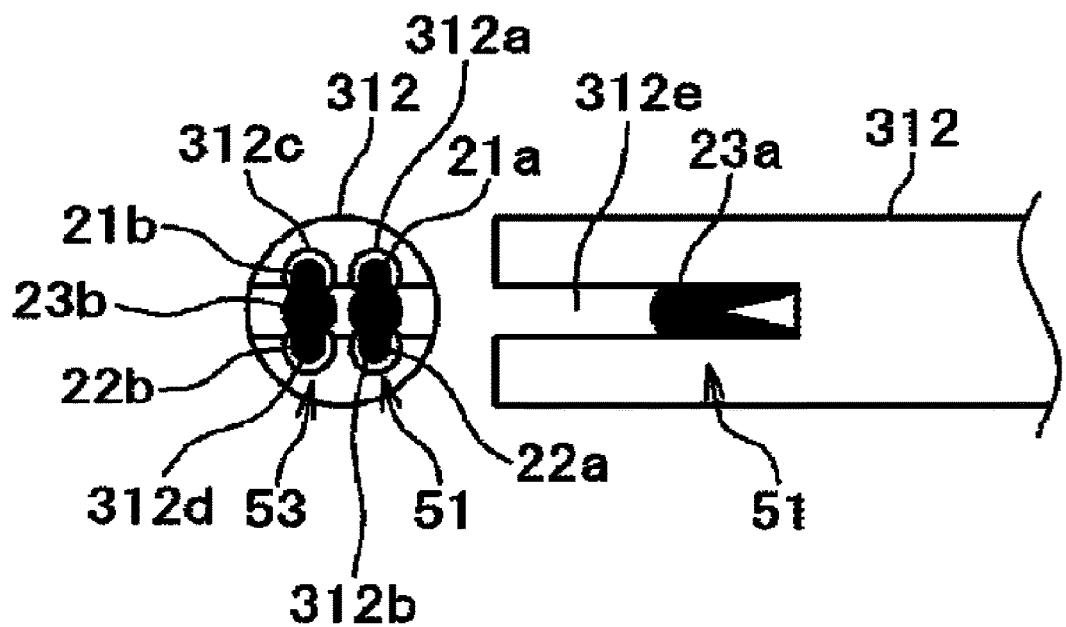
FIGS. 7A and 7B are diagrams schematically illustrating a front end (tip) of an insulating pipe of the temperature meter 300 shown in FIG. 5. Specifically.

Subsequently, a structure of the temperature meter 300 according to the embodiments will be described with reference to FIGS. 5 through 7. FIG. 5 is a diagram schematically illustrating a cross-section of the temperature meter 300 according to the embodiments described herein. FIG. 6 is a diagram schematically illustrating an enlarged view of a cross-section of a circle "A" shown in FIG. 5. FIGS. 7A and 7B are diagrams schematically illustrating a front end (tip) of an insulating pipe 312 of the temperature meter 300. Specifically, FIG. 7A is a diagram schematically illustrating the front end of the insulating pipe 312 when viewed from a direction "B" shown in FIG. 6 and FIG. 7B is a diagram schematically illustrating the front end of the insulating pipe 312 when viewed from the same direction as FIG. 6. For example, as shown in FIG. 3, lengths of the temperature meters 300a through 300g corresponding to the U1 zone heater 208a through the L2 zone heater 208g are the same. As such, front ends of the temperature meters 300a through 300g protrude with a predetermined amount from the inner surface of the furnace body of the heater 208 (more accurately, the ribs 211). A protection pipe 313 of the temperature meter 300h corresponding to the Sub-U zone heater 208h is set to be longer than those of the temperature meters 300a through 300g. As such, the temperature meter 300h is inserted into the ceiling 208t perpendicular to the tube axis of the reaction tube 222 through an outer periphery of the furnace body of the heater 208 and the front end of the temperature meter 300h is located on the tube axis of the reaction tube 222 outside the reaction tube 222. A front end of the protection pipe 313 is installed such that the front end of the protection pipe 313 is exposed from the heat insulating material of the ceiling 208t.

As shown in FIG. 5, the temperature meter 300, which accommodates the heater thermocouple 51 and the overheat detection thermocouple 53, includes the insulating pipe 312 and the protection pipe 313. The protection pipe 313 is of a cylindrical shape whose upper end is closed and whose lower end is open. That is, an opening is provided at the lower end of the protection pipe 313. For example, the protection pipe 313 is made of a highly heat resistant material such as recrystallized alumina ($Al_2O_3$), mullite and stainless steel. It is known that the recrystallized alumina easily transmits infrared rays from the heating element at 1,000° C. or lower.

As shown in FIGS. 6 and 7, the insulating pipe 312 is of a rod shape with a predetermined cross section. An outer diameter of the insulating pipe 312 is set such that the insulating pipe 312 can be inserted into the protection pipe 313. For example, four internal holes 312a, 312b, 312c and 312d are provided in the insulating pipe 312. At one end of the insulating pipe 312, a groove 312e is formed in the lateral direction by being slotted (that is, subject to a slotting process) so as to divide the four internal holes 312a, 312b, 312c and 312d into two pairs (that is, a pair of the internal holes 312a and 312c and a pair of the internal holes 312b and 312d). The internal holes 312a and 312c are provided adjacent in the left-right direction, and the internal holes 312b and 312d are provided adjacent in the left-right direction. For example, the insulating pipe 312 is made of alumina, and an inner diameter of each of the internal holes 312a through 312d is set such that wires (also referred to as "thermocouple wires") can be inserted through each of the internal holes 312a through 312d. A width of the groove 312e is set such that the internal holes 312a through 312d can be sufficiently exposed on an inner surface of the groove 312e.

The heater thermocouple 51 includes a thermocouple junction 23a and two thermocouple wires 21a and 22a attached to the thermocouple junction 23a. For example, the thermocouple wire 21a is a positive wire, and is made of platinum rhodium. For example, the thermocouple wire 22a is a negative wire, and is made of platinum. The thermocouple wires 21a and 22a of the heater thermocouple 51 are inserted into the internal holes 312a and 312b, respectively. The thermocouple junction 23a of the heater thermocouple 51 is disposed close to an inner side of the groove 312e.

The overheat detection thermocouple 53 includes a thermocouple junction 23b and two thermocouple wires 21b and 22b attached to the thermocouple junction 23b. For example, the thermocouple wire 21b is a positive wire, and is made of platinum rhodium. For example, the thermocouple wire 22b is a negative wire, and is made of platinum. The thermocouple wires 21b and 22b of the overheat detection thermocouple 53 are inserted into the internal holes 312c and 312d, respectively. The thermocouple junction 23b of the overheat detection thermocouple 53 is disposed close to the inner side of the groove 312e. That is, the heater thermocouple 51 and the overheat detection thermocouple 53 are provided side by side so that the thermocouple wires extending from the thermocouple junctions 23a and 23b thereof bridges across the groove 312e. As a result, even if there is a temperature gradient in the vertical direction (tube axis direction), both of the heater thermocouple 51 and the overheat detection thermocouple 53 can detect the same temperature. Further, distances in a "B" direction from the front end of the protection pipe 313 to the thermocouple junctions 23a and 23b are substantially equal, and the distances can be set to be substantially half of a protruding length of the front end of the protection pipe 313 from the ribs 211. For example, when the protruding length is 11 mm, the distances are set to 5.5 mm.

A structure of the temperature meter 300h corresponding to the Sub-U zone heater 208h is the same as that of the temperature meter 300 except for the length of the protection pipe 313 and lengths of the thermocouple wires 21a, 22a, 21b and 22b.

As described above, the heater thermocouple 51 and the overheat detection thermocouple 53 are provided such that the thermocouple junctions 23a and 23b are disposed in an inner space of the front end of the protection pipe 313. Further, the thermocouple wires 21a, 22a, 21b and 22b are inserted into the four internal holes of the insulating pipe 312, respectively, and are pulled out from an end surface opposite to the front end of the insulating pipe 312 to an outer surface of the heater 208 so as to be connected to a connector 314. The insulating pipe 312 and the protection pipe 313 are preferably configured with a thin structure in order to reduce its heat capacity. For example, the outer diameter of the insulating pipe 312 is set to 4 mm or less, and an outer diameter of the protection pipe 313 is set to 6 mm or less.

Figure 8:
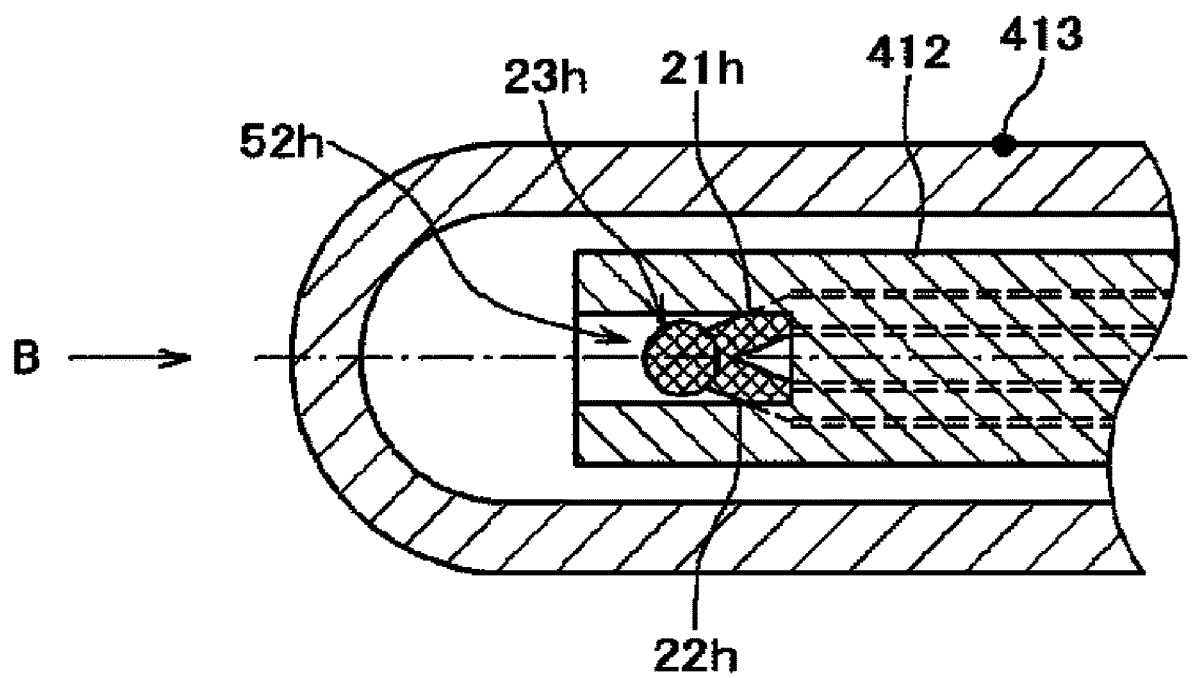
FIG. 8 is a diagram schematically illustrating a front end of a temperature meter 400 according to the embodiments described herein.
Figures 9A, 9B:
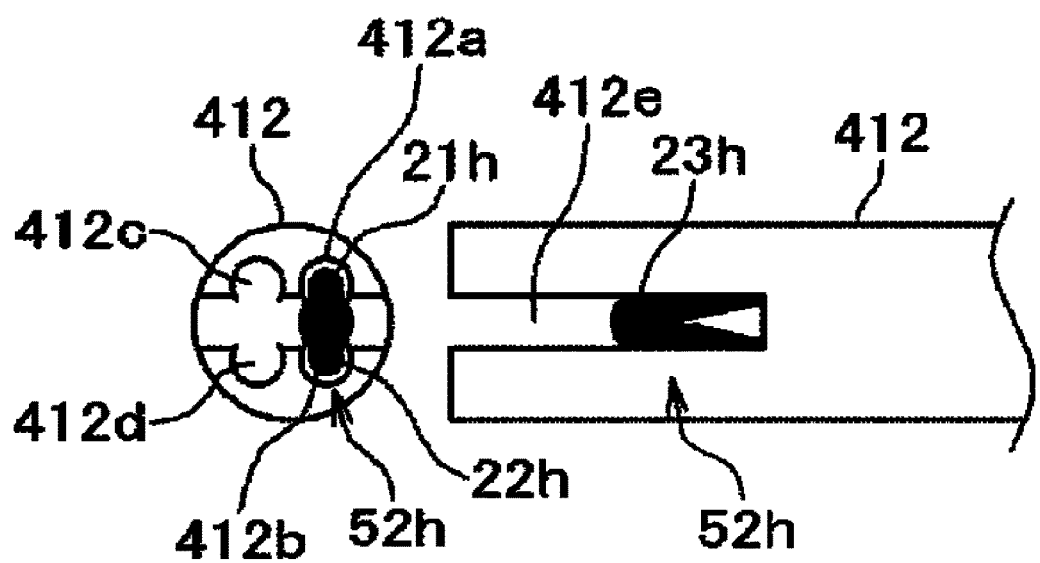
FIGS. 9A and 9B are diagrams schematically illustrating a front end of an insulating pipe of the temperature meter 400 shown in FIG. 8. Specifically.

Subsequently, a structure of a temperature meter 400 (for example, the temperature meter 400h), which accommodates the cascade thermocouple 52h, according to the embodiments will be described with reference to FIGS. 8 and 9. FIG. 8 is a diagram schematically illustrating a front end of the temperature meter 400 according to the embodiments described herein. FIGS. 9A and 9B are diagrams schematically illustrating a front end (tip) of an insulating pipe 412 of the temperature meter 400. Specifically, FIG. 9A is a diagram schematically illustrating the front end of the insulating pipe 412 when viewed from a direction "B" shown in FIG. 8 and FIG. 9B is a diagram schematically illustrating the front end of the insulating pipe 412 when viewed from the same direction as FIG. 8. A basic structure of the temperature meter 400 is the same as that of the temperature meter 300. However, the temperature meter 400 is set to be longer than the temperature meter 300. The temperature meter 400 is inserted perpendicular to the tube axis of the reaction tube 222 through the outer periphery of the furnace body of the heater 208 such that a front end of a protection pipe 413 is on the tube axis of the reaction tube 222 and is disposed between the front end of the temperature meter 300h and the upper end of the reaction tube 222.

Similar to the insulating pipe 312, the insulating pipe 412 is of a rod shape with a predetermined cross section. An outer diameter of the insulating pipe 412 is set such that the insulating pipe 412 can be inserted into the protection pipe 413. For example, four internal holes 412a, 412b, 412c and 412d are provided in the insulating pipe 412. At one end of the insulating pipe 412, a groove 412e is formed by slotted (that is, subject to a slotting process) so as to divide the four internal holes 412a, 412b, 412c and 412d into two pairs (that is, a pair of the internal holes 412a and 412c and a pair of the internal holes 412b and 412d). The internal holes 412a and 412c are provided adjacent in the left-right direction, and the internal holes 412b and 412d are provided adjacent in the left-right direction.

Similar to the heater thermocouple 51, the cascade thermocouple 52h includes a thermocouple junction 23h and two thermocouple wires 21h and 22h attached to the thermocouple junction 23h. For example, the thermocouple wire 21h is a positive wire, and is made of platinum rhodium. For example, the thermocouple wire 22h is a negative wire, and is made of platinum. The thermocouple wires 21h and 22h of the cascade thermocouple 52h are inserted into the internal holes 412a and 412b, respectively. The thermocouple junction 23h of the cascade thermocouple 52h is disposed close to an inner side of the groove 412e. No thermocouple wire is inserted into the internal holes 412c and 412d.

Substrate Processing Operation According to Present Embodiments

Figure 11:
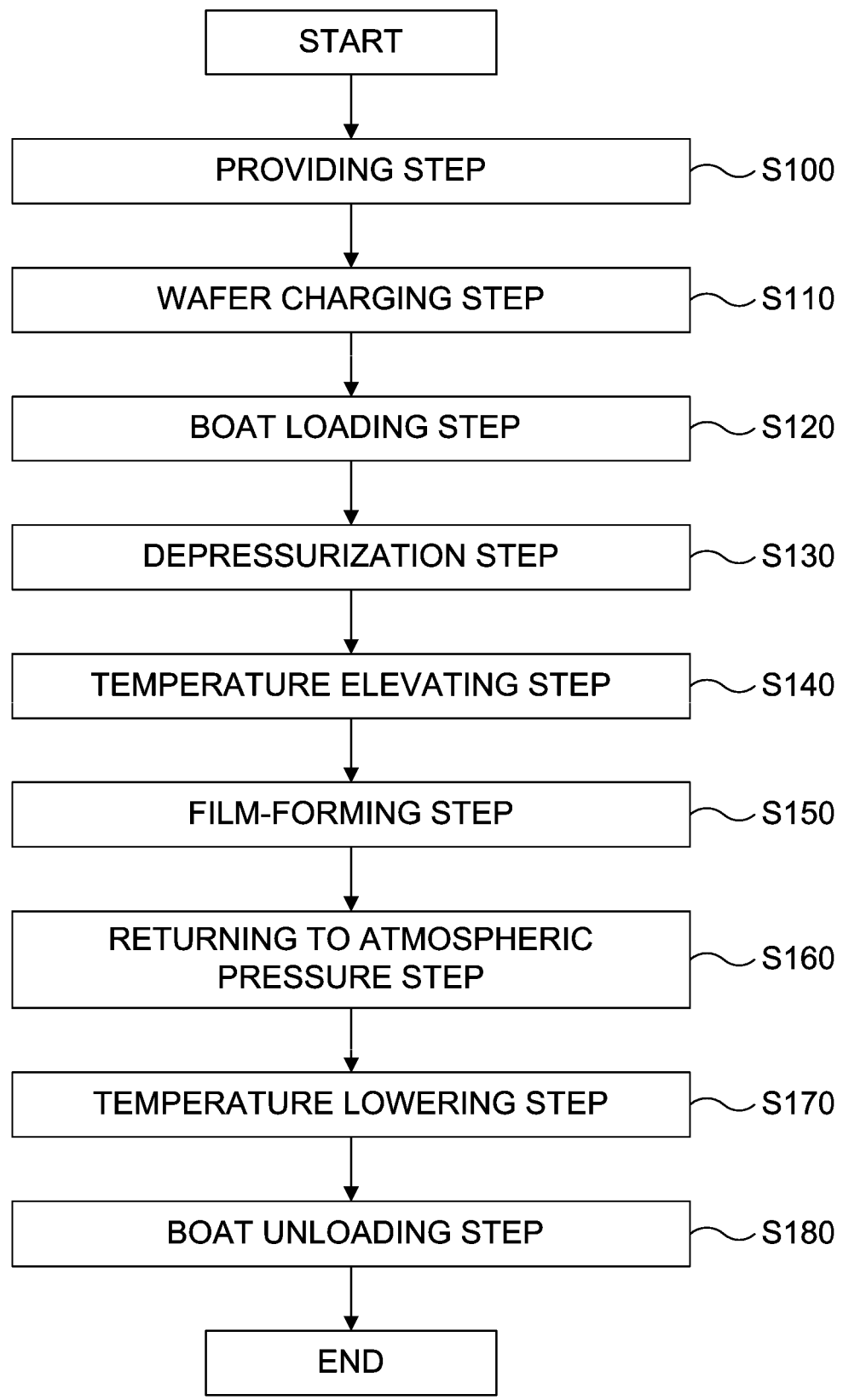
FIG. 11 is a flowchart schematically illustrating a substrate processing according to the embodiments described herein.

Subsequently, a substrate processing operation according to the present embodiments will be described by way of an example in which a film-forming process in a method of manufacturing an integrated circuit (IC) is performed as a substrate processing. The substrate processing operation will be described with reference to FIG. 11. FIG. 11 is a flowchart schematically illustrating the substrate processing according to the embodiments described herein. The substrate processing operation is controlled by the controller 280. First, in a providing step S100, the substrate processing apparatus 10 according to the embodiments is provided to perform the substrate processing operation. Then, in a wafer charging step S110, the wafers 200 are charged (transferred or loaded) into the boat 217. As a result, the wafers 200 are arranged in the boat 217 in a horizontal orientation in a multistage manner with their centers aligned with one another. Subsequently, in a boat loading step S120, the boat 217 charged with the wafers 200 is loaded (transferred) into the process chamber 204 (boat loading). Subsequently, in a depressurization step S130, an inner pressure of the reaction tube 222 is depressurized to a predetermined vacuum degree by the vacuum pump 234 through the exhaust pipe 231, and in a temperature elevating step S140, an inner temperature of the reaction tube 222 is elevated to a predetermined temperature by the heater 208 based on the temperature measured by the temperature detecting structure.

Subsequently, in a film-forming step S150, while the boat 217 is rotated, a predetermined source gas is supplied to the gas nozzle 224 and introduced into the process chamber 204. The source gas introduced into the process chamber 204 flows out into the reaction tube 222, and is exhausted through the exhaust pipe 231 provided in the manifold 206. In the film-forming step S150, the inner temperature of the reaction tube 222 is maintained at the predetermined temperature by the heater 208 based on the temperature measured by the temperature detecting structure. Then, the source gas flows in parallel in spaces between the wafers 200 (for example, a space between the wafer 200 and a wafer immediately above or immediately below the wafer 200). Thereby, a film is formed on a surface of the wafer 200 by the source gas while the source gas contacts the surface of the wafer 200.

After a desired film-forming process in the film-forming step S150 is performed as described above, the supply of the source gas is stopped, and in a returning to atmospheric pressure step S160, the inner pressure of the process chamber 204 is returned to the atmospheric pressure by an inert gas. Then, in a temperature lowering step S170, the inner temperature of the reaction tube 222 is lowered to a predetermined temperature based on the temperature measured by the temperature detecting structure. Then, in a boat unloading step S180, the lower end opening of the process chamber 204 is opened by lowering the seal cap 219, and the processed wafers 200 are transferred (unloaded) out of the process chamber 204 while being supported by the boat 217 (boat unloading).

Figure 10:
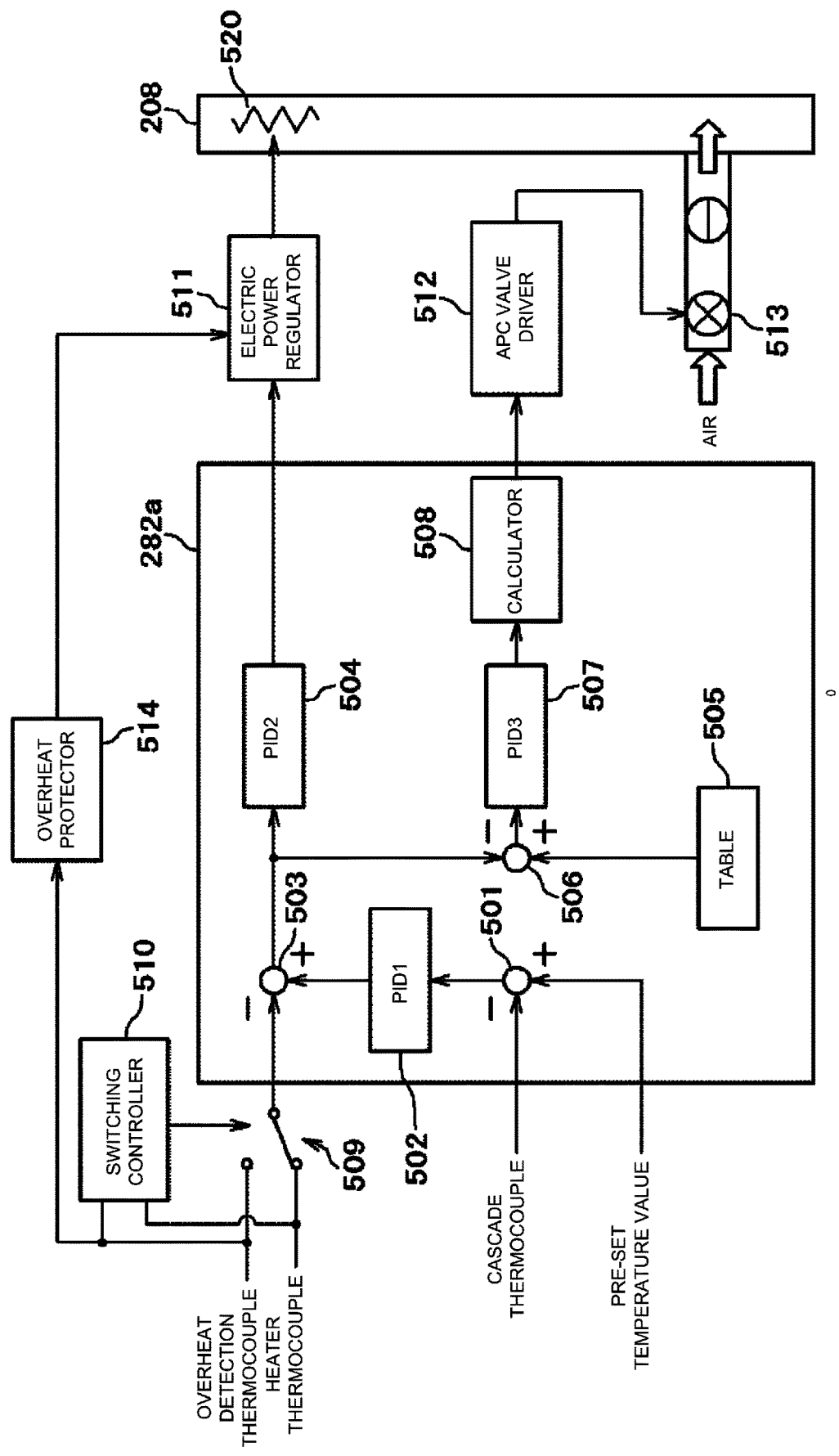
FIG. 10 is a diagram schematically illustrating an exemplary configuration of performing a PID control process of a temperature controller shown in FIG. 3.

In the temperature elevating step S140, a temperature maintaining operation in the film-forming step S150 and the temperature lowering step S170 described above, based on the temperatures measured by the heater thermocouple 51 and the cascade thermocouple 52, a temperature control process (for example, a PID (proportional integral derivative) control process) is performed by a temperature regulator of the temperature controller 282 of the controller 280 such that the measured temperatures becomes the same as a target temperature. FIG. 10 is a diagram schematically illustrating an exemplary configuration of performing the PID control process of a temperature regulator 282a of the temperature controller 282. As shown in FIG. 10, a temperature of the heater 208 is controlled by heating by a resistance heating heater 520 and cooling by air. That is, the temperature of the heater 208 is controlled by an amount of the electric power to the resistance heating heater 520 and an opening degree of an APC valve 513. The temperature regulator 282a of the temperature controller 282 may include: a first subtractor 501 configured to output a temperature deviation between a pre-set temperature value input from the controller 280 serving as a main controller and the temperature of the cascade thermocouple 52; a first PID calculator ("PID1" shown in FIG. 10) 502 configured to perform a PID calculation according to an output of the first subtractor 501 and configured to instruct a value to be followed by the measured temperature of the heater thermocouple 51; a second subtractor 503 configured to output a temperature deviation between an output of the first PID calculator ("PID1") 502 and the temperature of the heater thermocouple 51; and a second PID calculator ("PID2" shown in FIG. 10) 504 configured to perform a PID calculation according to an output of the second subtractor 503 and configured to instruct an operation amount to an electric power regulator 511. The electric power regulator 511 is configured to supply the electric power according to the instructed operation amount to the resistance heating heater 520.

The temperature regulator 282a may further include: a third subtractor 506 configured to output a deviation between a pre-set heater temperature value stored in a table 505 and the output of the second subtractor 503; a third PID calculator ("PID3" shown in FIG. 10) 507 configured to perform a PID calculation according to an output of the third subtractor 506 and to output a control value to a calculator 508; and the calculator 508 configured to convert an output of the third PID calculator ("PID3") 507 into the opening degree of the APC valve 513. When the temperature of the heater thermocouple 51 is higher than the pre-set heater temperature value (that is, the deviation is greater than a pre-set temperature deviation), the third PID calculator 507 performs a control calculation so that the deviation becomes equal to or less than the pre-set temperature deviation, and the calculator 508 converts a result of the control calculation into an air cooling amount such as an intake air volume (the opening degree of the APC valve 513) and outputs the air cooling amount. An APC valve driver 512 is controlled by an output of the calculator 508, the opening degree of the APC valve 513 is controlled by the APC valve driver 512, and the air cooling amount of the heater 208 is controlled.

In the substrate processing apparatus 10, the heater thermocouple 51 is provided between the heater 208 and the reaction tube 222 to measure a temperature in the vicinity of the heater 208, and simultaneously, the cascade thermocouple 52 is provided inside the reaction tube 222 to measure the inner temperature of the reaction tube 222. Based on those measured temperatures, the temperature regulator 282a of the temperature controller 282 feedback-controls the heater 208 so that the inner temperature of the reaction tube 222 becomes a desired target temperature. The heater 208 is divided into the plurality of zones (heating zones), and the temperature of each heating zone is controlled by using each of the heater thermocouples 51a through 51h.

According to the present embodiments, as a structure of measuring the heater temperature (which is a control amount), there are provided: a switch 509 configured to selectively connect the heater thermocouple 51 and the overheat detection thermocouple 53 to the second subtractor 503; a switching controller (disconnection detector) 510 configured to control the switch 509 based on at least a state of the heater thermocouple 51; and an overheat protector 514 configured to output a signal to shut off the heater power to the electric power regulator 511 when it detects that the temperature of the overheat detection thermocouple 53 is abnormally high. Signals from the heater thermocouple 51 and the overheat detection thermocouple 53 are subject to a processing such as well-known cold contact compensation, linearization and analog-digital conversion before or after being input to a component such as the switch 509, and cold contact compensation. In addition, a burnout detection circuit may be provided at a cold contact compensation circuit.

The switch 509 may also be implemented by disconnecting a connection from one thermocouple in a circuit configured to synthesize (average) the signals from the heater thermocouple 51 and the overheat detection thermocouple 53. The switching controller 510 monitors the detected temperature of the heater thermocouple 51. When the burnout detection circuit detects a vibration (noise), a temperature or a voltage higher than a predetermined first threshold value, which appear at the time of disconnection, the switching controller 510 controls the switch 509 so as to select the signal from the overheat detection thermocouple 53. The overheat protector 514 monitors the detected temperature of the overheat detection thermocouple 53. When a temperature higher than a predetermined second threshold value (which corresponds to the temperature of the heater 208, 800° C. for example, that cannot be reached in normal use) is continuously detected for a predetermined time or longer, the overheat protector 514 outputs the signal to shut off the heater power described above. According to the present embodiments, the second threshold value is lower than the first threshold value. A short mode failure of the thermocouple assumed by the overheat protector 514 is less frequent than an open mode failure. Therefore, the overheat protector 514 may be further configured to output an alarm to the controller 280 instead of outputting the signal to shut off the heater power described above when the heater thermocouple 51 is normal (for example, the detected temperature of the heater thermocouple 51 is within a range between a third threshold value which is higher than a cold contact temperature and the second threshold value) and the detected temperature of the overheat detection thermocouple 53 is higher than the first threshold value. As a result, it is possible to prevent the heater power from forcibly being shut off due to disconnection of the overheat detection thermocouple 53.

As described above, the substrate processing apparatus 10 is provided with a backup function of switching to the overheat detection thermocouple 53 and continuously performing the temperature control process when the heater thermocouple 51 becomes unusable (for example, when the heater thermocouple 51 is disconnected). Other criteria may be used as switching criteria (whether the heater thermocouple 51 or the overheat detection thermocouple 53 being in use is normal). For example, when a temperature difference between the heater thermocouple 51 and the overheat detection thermocouple 53 is greater than or equal to a predetermined value, it may be determined that the thermocouple indicating a high temperature is disconnected. For example, when the output of the second subtractor 503 (an error signal of an internal loop) or the like continuously exceeds a predetermined value for a predetermined time or longer, it may be determined that the thermocouple is disconnected. Even when the thermocouple used for the temperature control process is switched from the heater thermocouple 51 to the overheat detection thermocouple 53 and the temperature control process is continuously performed, there is no difference in the positions where the heater thermocouple 51 and the overheat detection thermocouple 53 are provided. Thus, the measured temperature does not vary due to the difference in the positions where the heater thermocouple 51 and the overheat detection thermocouple 53, and fluctuations in a heater output (excluding fluctuations for returning to the normal value) can be prevented.

According to the embodiments, it is possible to provide at least one effect among (A1) and (A2) described below.

(A1) The protection pipe is provided such that the protection pipe is inserted into the heater, and the heater thermocouple and the overheat detection thermocouple are disposed in the protection pipe. Therefore, temperature characteristics of the overheat detection thermocouple can be brought closer to temperature characteristics of the heater thermocouple. As a result, even when the heater thermocouple cannot be used due to a problem such as the disconnection, it is possible to measure the temperature by switching to the overheat detection thermocouple.

(A2) The four internal holes are provided in one insulating pipe, a pair of the heat thermocouples and a pair of the overheat detection thermocouples are inserted into the four internal holes, and only one insulating pipe is provided in one protection pipe. Therefore, it is possible to reduce the outer diameter of the protection pipe. Thereby, it is possible to easily install the protection pipe in the heater.

Other Embodiments

While the technique of the present disclosure is described in detail by way of the embodiments, the above-described technique is not limited thereto. The above-described technique may be modified in various ways without departing from the gist thereof. For example, the above-described embodiments are described by way of an example in which the temperature control process is continuously performed by switching to the overheat detection thermocouple 53 when the heater thermocouple 51 is disconnected. However, the above-described technique is not limited thereto. For example, a third thermocouple may be further provided as a thermally single body with the heater thermocouple 51 and the overheat detection thermocouple 53, and the temperature control process may be continuously performed by switching to the third thermocouple when both the heater thermocouple 51 and the overheat detection thermocouple 53 are disconnected. For example, the above-described embodiments are described by way of an example in which the temperature controller 282 is configured to perform the PID control process. However, the above-described technique is not limited thereto. For example, a prediction model memory area in which a reference temperature of at least one among the temperature of the heater (heater temperature) and an inner temperature of the process chamber (inner temperature of the furnace), a steady-state power supply value to the heater controlled to the reference temperature and a prediction model for predicting a predicted temperature of at least one among the heater temperature and the inner temperature of the furnace are stored may be further provided. By obtaining temperature data and power supply values, creating a predetermined equation using the prediction model, and calculating a solution that minimizes a deviation between the reference temperature and the predicted temperature based on the equation, the temperature control process may be performed such that the power supply value output to the heater can be optimized.

For example, the above-described embodiments are described by way of an example in which a batch and hot wall type apparatus is use. However, the above-described technique is not limited thereto. For example, the above-described technique may be applied to a cold wall type apparatus, a single-wafer type apparatus or a multi-wafer type apparatus. That is, the above-described technique may be applied to an apparatus in which the first temperature sensor and the second temperature sensor are provided closer to the heater than the third temperature sensor (that is, the first temperature sensor and the second temperature sensor are thermally coupled by the heater), or an apparatus in which the third temperature sensor is provided closer to the object to be heated (that is, the substrate) than the first temperature sensor and the second temperature sensor. Further, the above-described technique may be applied not only to a semiconductor manufacturing apparatus but also to an apparatus capable of processing a glass substrate such as an LCD (liquid crystal display) manufacturing apparatus or other substrate processing apparatuses. The processing content of the substrate processing may include various heat treatment processes such as a CVD (chemical vapor deposition) process, a PVD (physical vapor deposition) process, a modification process such as oxidation process and a nitriding process, a surface treatment process, an annealing process, an etching process, a photoresist baking process and an ashing process.

As described above, according to some embodiments in the present disclosure, it is possible to continuously and stably perform the temperature control process.

What is claimed is:

1. A substrate processing apparatus comprising:
   a reaction tube in which a substrate is accommodated;
   a furnace body provided so as to surround and cover the reaction tube;
   a heating element divided into a plurality of zones and provided in the furnace body or on an inner surface of the furnace body;
   a plurality of first temperature sensors provided for the plurality of zones, respectively, such that a temperature measuring point of each of the first temperature sensors is arranged in a vicinity of the heating element;
   a plurality of second temperature sensors provided for the plurality of zones, respectively, such that a temperature measuring point of each of the second temperature sensors is provided side by side with a temperature measuring point of a corresponding one of the first temperature sensors;
   a plurality of temperature meters provided at the plurality of zones and configured to hold the temperature measuring point of each of the second temperature sensors and the temperature measuring point of the corresponding one of the first temperature sensors to be side by side with each other in a corresponding one of protection pipes, wherein each of the temperature meters penetrates an outer periphery of the furnace body along a direction perpendicular to a central axis of the reaction tube such that a front end of one of the protection pipes is located outside the reaction tube and on a tube axis of the reaction tube;
   a third temperature sensor provided in or outside the reaction tube at a location closer to the substrate than the temperature measuring point of a corresponding one of the first temperature sensors and farther away from the heating element than the temperature measuring point of the corresponding one of the first temperature sensors; and a temperature regulator configured to control a calorific value of the heating element while referring to a temperature of each of the first temperature sensors so that a temperature detected by the third temperature sensor becomes equal to a predetermined target temperature, wherein, when an abnormality of one of the first temperature sensors is detected, the temperature regulator continues to control the calorific value by referring to a temperature of each of the second temperature sensors instead of the temperature of each of the first temperature sensors.

2. The substrate processing apparatus of claim 1, wherein a plurality of substrates comprising the substrate are accommodated in the reaction tube, and an opening is provided at one end of the reaction tube.

3. The substrate processing apparatus of claim 1, further comprising an overheat protector configured to, when a temperature of one of the second temperature sensors is abnormally high, reduce a calorific value of a portion of the heating element located in a zone among the zones corresponding to the one of the second temperature sensors.

4. The substrate processing apparatus of claim 1, wherein a plurality of third temperature sensors comprising the third temperature sensor are provided for the plurality of zones, respectively, and the temperature regulator is further configured to control the calorific value of the heating element with respect to each of the zones.

5. The substrate processing apparatus of claim 1, wherein the plurality of temperature meters and the plurality of second temperature sensors are provided for the plurality of zones, respectively, and each of the first temperature sensors and each corresponding one of the second temperature sensors are provided in each corresponding one of the protection pipes.

6. The substrate processing apparatus of claim 5, wherein each of the temperature meters comprises:

an insulating pipe of a rod shape with a predetermined cross section, wherein an outer diameter of the insulating pipe is set so as to allow the insulating pipe to be inserted into one of the protection pipes, four internal holes are provided in the insulating pipe, and one end of the insulating pipe is slotted to form a groove so as to divide the four internal holes into two pairs of internal holes; and the one of the protection pipes penetrating the furnace body, wherein wires of each of the first temperature sensors and wires of each of the second temperature sensors are inserted into the two pairs of the internal holes, respectively, and the temperature measuring point of each of the first temperature sensors and the temperature measuring point of each of the second temperature sensors are held side by side with each other in the groove, respectively.

7. The substrate processing apparatus of claim 5, wherein a protection pipe of each of the temperature meters is provided so as to penetrate the furnace body along a horizontal direction such that a front end of the protection pipe reaches the inner surface of the furnace body.

8. A substrate processing apparatus comprising:
a reaction tube in which a substrate is accommodated;
a furnace body provided so as to surround and cover the reaction tube;
a heating element divided into a plurality of zones and provided in the furnace body or on an inner surface of the furnace body;
a plurality of first temperature sensors provided for the plurality of zones, respectively, such that a temperature measuring point of each of the first temperature sensors is arranged in vicinity of the heating element;
a plurality of second temperature sensors provided for the plurality of zones, respectively, such that a temperature measuring point of each of the second temperature sensors is provided side by side with a temperature measuring point of a corresponding one of the first temperature sensors;
a plurality of temperature meters provided at the plurality of zones and configured to hold the temperature measuring point of each of the second temperature sensors and the temperature measuring point of the corresponding one of the first temperature sensors to be side-by-side with each other in a corresponding one of protection pipes, each of the temperature meters penetrates an outer periphery of the furnace body along a direction perpendicular to a central axis of the reaction tube such that a front end of one of the protection pipes is located outside the reaction tube and on a tube axis of the reaction tube, wherein a portion of the heating element in the plurality of zones facing a circumferential surface of the reaction tube is exposed over the inner surface of the furnace body, and the other portion of the heating element in a first zone, among the plurality of zones, facing a first end of the reaction tube opposite to a second end of the reaction tube on which an opening is provided is arranged above the first end and under a ceiling portion of the furnace body facing the first end, and lengths of the plurality of temperature meters in the plurality of zones facing the circumferential surface of the reaction tube are equal to one another such that the front end of the one of the protection pipes protrudes with a predetermined length from the inner surface of the furnace body, and a length of a temperature meter of the first zone is longer than those in the plurality of zones facing the circumferential surface of the reaction tube such that the temperature meter of the first zone penetrates the outer periphery of the furnace body along a direction perpendicular to the tube axis of the reaction tube and a front end of a protection pipe of the temperature meter of the first zone is located outside the reaction tube and on the tube axis of the reaction tube.

9. The substrate processing apparatus of claim 8, further comprising:

an additional temperature sensor provided in the first zone at a location closer to the substrate than a temperature measuring point of a corresponding one of the first temperature sensors;

an additional temperature meter configured to support, in an additional protection pipe, a temperature measuring point of the additional third temperature sensor of the first zone; and a temperature regulator configured to control a calorific value of the heating element while referring to a temperature of each of the first temperature sensors so that a temperature detected by the additional temperature sensor becomes equal to a predetermined target temperature, wherein the additional temperature meter penetrates the outer periphery of the furnace body along a direction perpendicular to the tube axis of the reaction pipe such that a front end of the additional protection pipe is located on the tube axis of the reaction tube and between a front end of the temperature meter of the first zone.

10. The substrate processing apparatus of claim 9, wherein the additional temperature meter comprises:
the additional protection pipe made of a material different from the protection pipe of the temperature meter; and
an additional insulating pipe of a rod shape with a predetermined cross section, wherein an outer diameter of the additional insulating pipe is set so as to allow the additional insulating pipe to be inserted into the additional protection pipe, four internal holes are provided in the additional insulating pipe, and a first end of the additional insulating pipe is slotted to form a groove,
wherein wires of the additional temperature sensor in the first zone are inserted into two of the four internal holes of the additional insulating pipe so as to support the temperature measuring point of the additional temperature sensor.

11. A method of manufacturing a semiconductor device, comprising:
(a) providing the substrate processing apparatus of claim 1;
(b) loading the substrate into the reaction tube; and
(c) heating the reaction tube by controlling the calorific value of the heating element while referring to the temperature of each of the first temperature sensors.

12. A heater comprising:
a furnace body provided so as to surround and cover a reaction tube;
a heating element divided into a plurality of zones and provided in the furnace body or on an inner surface of the furnace body;
a plurality of first temperature sensors provided for the plurality of zones, respectively, such that a temperature measuring point of each of the first temperature sensors is arranged in vicinity of the heating element;
a plurality of second temperature sensors provided for the plurality of zones, respectively, such that a temperature measuring point of each of the second temperature sensors is provided side by side with a temperature measuring point of a corresponding one of the first temperature sensors; and
a plurality of temperature meters provided at the plurality of zones and configured to hold the temperature measuring point of each of the second temperature sensors and the temperature measuring point of the corresponding one of the first temperature sensors to be side by side with each other in a corresponding one of protection pipes, wherein a protection pipe of each of the temperature meters penetrates the furnace body along a horizontal direction such that a front end of the protection pipe reaches the inner surface of the furnace body,
wherein each of the temperature meters penetrates an outer periphery of the furnace body along a direction perpendicular to a central axis of the reaction tube such that a front end of one of the protection pipes is located outside the reaction tube and on a tube axis of the reaction tube,
wherein a portion of the heating element in the plurality of zones facing a circumferential surface of the reaction tube is exposed over the inner surface of the furnace body, and the other portion of the heating element in a first zone, among the plurality of zones, facing a first end of the reaction tube opposite to a second end of the reaction tube on which an opening is provided is arranged above the first end and under a ceiling portion of the furnace body facing the first end, and
wherein lengths of the plurality of temperature meters in the plurality of zones facing the circumferential surface of the reaction tube are equal to one another such that the front end of the one of the protection pipes protrudes with a predetermined length from the inner surface of the furnace body, and a length of a temperature meter of the first zone is longer than those in the plurality of zones facing the circumferential surface of the reaction tube such that the temperature meter of the first zone penetrates the outer periphery of the furnace body along a direction perpendicular to the tube axis of the reaction tube and a front end of a protection pipe of the temperature meter of the first zone is located outside the reaction tube and on the tube axis of the reaction tube.

13. The heater of claim 12, wherein each of the protection pipes is provided such that the front end thereof is located in vicinity of a corresponding portion of the heating element.

14. The heater of claim 13, further comprising an insulating pipe of a rod shape with a predetermined cross section, wherein four internal holes are provided in the insulating pipe and one end of the insulating pipe is slotted to form a groove such that the insulating pipe is provided in each of the protection pipes.

15. The heater of claim 14, wherein wires of each of the first temperature sensors and wires of each of the second temperature sensors are inserted into the four internal holes, respectively, and the temperature measuring point of each of the first temperature sensors and the temperature measuring point of each of the second temperature sensors are held side by side with each other in the groove, respectively.

* * * * *